(12) United States Patent
Curts et al.

(10) Patent No.: US 10,569,449 B1
(45) Date of Patent: Feb. 25, 2020

(54) NANOIMPRINT LITHOGRAPHY SYSTEM AND METHOD

(71) Applicant: Facebook Technologies, LLC, Menlo Park, CA (US)

(72) Inventors: Kyle Justin Curts, Snohomish, WA (US); Matthew E. Colburn, Woodinville, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 154 days.

(21) Appl. No.: 15/703,926

(22) Filed: Sep. 13, 2017

(51) Int. Cl.
*B29C 59/00* (2006.01)
*B29C 35/08* (2006.01)
*B29C 43/00* (2006.01)
*G03F 7/033* (2006.01)
*G03F 7/00* (2006.01)
*B29C 59/02* (2006.01)

(52) U.S. Cl.
CPC ........ *B29C 35/0888* (2013.01); *B29C 43/003* (2013.01); *B29C 59/022* (2013.01); *G03F 7/0002* (2013.01); *G03F 7/033* (2013.01)

(58) Field of Classification Search
CPC ........................ B29C 59/022; B29C 2059/023
USPC .......................................... 264/293, 334, 335
See application file for complete search history.

(56) References Cited

U.S. PATENT DOCUMENTS

| 8,845,320 B2 * | 9/2014 | De Schiffart | B82Y 10/00 264/293 |
| 2012/0052241 A1 * | 3/2012 | King | B08B 17/06 428/141 |
| 2014/0001675 A1 * | 1/2014 | Nakamura | B82Y 10/00 264/293 |

* cited by examiner

*Primary Examiner* — Christina A Johnson
*Assistant Examiner* — Xue H Liu
(74) *Attorney, Agent, or Firm* — Kilpatrick Townsend & Stockton LLP (57) ABSTRACT

A method for transferring a pattern from a template to a nanoimprint object. A perimeter portion of the nanoimprint object is supported by a perimeter support structure. A gas pressure induced force is applied to the nanoimprint object to facilitate bending of a central portion of the nanoimprint object in a direction toward a surface of the template until the central portion of the nanoimprint object is brought into contact with the surface of the template. While the nanoimprint object is held in contact with the surface of the template, the pattern from the template is transferred to a surface of the nanoimprint object thereby creating a patterned surface on the nanoimprint object.

31 Claims, 7 Drawing Sheets

NANOIMPRINT LITHOGRAPHY SYSTEM AND METHOD

BACKGROUND

In nanoimprint lithography, a mold or template having a surface with a nanopattern is used to imprint the nanopattern onto a surface of a nanoimprint object, e.g., a glass or polymer substrate. Typically, a substrate or wafer is held on a solid rigid flat surface of a vacuum chuck and a template is moved to essentially stamp the surface of the substrate. Many systems employ flexible molds and can be employed on rollers or can be attached to relatively complex actuation systems that can independently stamp sections of the flexible mold onto the surface of the substrate, e.g., from right to left. However, existing methods suffer from a number of issues, particularly for relatively thin, flexible substrates. For example, the substrate can be deformed in a non-uniform or uncontrolled manner as it is held against its vacuum chuck, and such deformations can lead to intense stresses and strains being present in the substrate during the imprint process. When the substrate is eventually released from the vacuum chuck, errors in the imprinted pattern can occur as the stresses release. In addition, when flexible molds are employed, the required bending of the mold itself can lead to imprint errors. Therefore, there is a need in the art to provide an improved method for nanoimprint lithography.

SUMMARY

The present disclosure relates generally to nanoimprint lithography. More particularly, techniques and systems are described for full field single step nanoimprint lithography.

In some embodiments, a method for transferring a pattern from a template to a nanoimprint object is disclosed. The method includes supporting a perimeter portion of the nanoimprint object by a perimeter support structure, applying a gas pressure induced force to the nanoimprint object to facilitate bending of a central portion of the nanoimprint object in a direction toward a surface of the template, and increasing the gas pressure induced force until the central portion of the nanoimprint object is brought into contact with the surface of the template. The method further includes transferring the pattern to a surface of the nanoimprint object while the nanoimprint object is held in contact with the surface of the template, thereby creating a patterned surface on the nanoimprint object.

In some embodiments, a system for transferring a pattern to a nanoimprint object is disclosed. The system includes a chuck, a perimeter support structure and template having a nanoimprint surface. The chuck includes a channel disposed along a peripheral portion of a surface of the chuck and a central recess disposed in a central region of the chuck. The perimeter support structure is supported within the channel. The template is supported within the central recess. The perimeter support structure, a surface of the template, and a surface of the chuck cooperate to form part of a chamber that encloses the template. The perimeter support structure is configured to form a seal between a nanoimprint object and the chuck when a nanoimprint object is placed on the perimeter support structure and a gas pressure induced force is applied to the nanoimprint object.

In some embodiments, a head mounted display is disclosed. The head mounted display includes an electronic display that emits image light and an optical system that receives the image light. The optical system includes a nanoimprinted optical element, formed by a nanoimprint lithography method. The method includes supporting a perimeter portion of a nanoimprint object by a perimeter support structure, applying a gas pressure induced force to the nanoimprint object to facilitate bending of a central portion of the nanoimprint object in a direction toward a surface of a template, and increasing the gas pressure induced force until the central portion of the nanoimprint object is brought into contact with the surface of the template. The method further includes transferring a nanoimprint pattern to a surface of the nanoimprint object while the nanoimprint object is held in contact with the surface of the template, thereby creating a patterned surface on the nanoimprint object.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

DETAILED DESCRIPTION

The present disclosure relates generally to nanoimprint lithography. More particularly, techniques are described for full-filed, single-step nanoimprint lithography.

According to certain embodiments, the method and system for nanoimprint lithography may be used, e.g., to produce near-eye display technology, diffractive optical elements, printed waveguides, lens arrays, flexible electronics, and the like. As used herein, the term "nanoimprint object" refers to a piece of material or substrate that will receive the nanoimprint pattern from a nanoimprint mold or template during the nanoimprint process. The nanoimprint object can have one or more blank or prepatterned surfaces and the nanoimprint object can be made from a flexible and/or compliant material. Examples of nanoimprint objects include single layer wafers (also referred to herein as "substrates") or even multilayer objects that include a base substrate (also referred to herein as a "substrate layer") coated with one or more layers of material, e.g., a nanoimprint object can include a glass or plastic substrate having a layer of imprint photoresist material disposed thereon. Other nanoimprint objects can be composite structures having several base layers and may or may not include a layer of imprint photoresist. According to certain embodiments, the nanoimprint objects may be planar shaped. As used herein, the term "planar" refers to a generally flat shape, though the shape need not be perfectly flat. In some embodiments a planar nanoimprint object can have any perimeter shape, e.g., a round or circular perimeter. Such an object is referred to herein as having a "planar circular" shape. In other embodiments, the planar object can have a rectangular perimeter and is referred to herein as having a "planar rectangular" shape. In a similar manner, other shapes are also possible without departing from the some of the present disclosure.

As used herein, the prefix "nano" is intended to refer to the length scale of the features being imprinted onto the object. Accordingly, the prefix "nanoimprint" should be interpreted broadly to refer to any pattern that may be transferred by a nanoimprint mold/template. For example, a nanoimprint pattern may have feature sizes in the range of 1,000 nm or less, 100 nm or less, 10 nm or less depending on the availability of suitable nanoimprint pattern templates/molds. Such molds can be created, e.g., using e-beam lithography or any other suitable method for nanofabrication. According to certain embodiments, e.g., in the case of optical elements, e.g., Fresnel lenses, phase masks, etc., that are manufactured by the method disclosed herein, the length scale of the imprinted features of the object will depend on the wavelength of light being used in the optical system within which the nanoimprinted optic resides, e.g., on the order of 10's or 100's of nm, as would be appreciated by one of ordinary skill in the art. In other applications, e.g., imprinting electronic structures for flexible electronics, it may be desired to imprint features that are as small as possible, e.g. 10 nm or less, as also would be appreciated by one of ordinary skill in the art.

Embodiments of the system and method can more accurately imprint a nanopattern onto a nanoimprint object by controllably deforming the nanoimprint object to be brought into contact with a rigid, patterned template (also referred to herein as an "imprint pattern template" and/or "mold"). According to certain embodiments, a gas pressure induced force can be used to elastically deform the nanoimprint object to bring a central portion of the nanoimprint object into contact with the rigid template during imprinting. According to certain embodiments, the gas pressure induced force can be created by creating a pressure differential between a gas-tight chamber and an outer region, where the nanoimprint object itself can form a flexible wall of the chamber.

More specifically, and as described below in reference to the drawings, in some embodiments, the gas-tight chamber can be formed by the inner surface of the nanoimprint object making peripheral contact with a seal (e.g. a ring shaped seal or gasket) that may be housed in a groove, e.g., a circular groove, of the chuck that houses the template. The structure of the chuck can also include a central recess (i.e., a cutout or notch) that houses the rigid template. An outer surface of this template makes contact with another seal thereby completing the outer periphery of the chamber. To generate the pressure induced force on the nanoimprint object, gas can be added to or removed from the chamber and or the region surrounding the chamber to alter a pressure differential between the chamber and the region surrounding the chamber. In some embodiments, the gas can include one or more gases that can improve the performance of the nanoimprint process, e.g., for acrylates, an inert gas can remove oxygen thereby inhibiting free radical reactions.

In some embodiments, one or more vacuum ports can be formed in the chuck. Gas may then be pumped out of the chamber and as the pressure differential on the nanoimprint object increases, the nanoimprint object deforms toward the mold, eventually making contact with the mold and transferring the pattern to the nanoimprint object, e.g., directly onto the inner surface of the nanoimprint object, in the case of a nanoimprint object having a pliable substrate, or the pattern can be transferred to a pliable layer that was previously coated onto a substrate layer of the nanoimprint object, e.g., a photoresist imprint layer and the like.

According to certain embodiments, the illumination of the photoresist layer may happen from the either side of the nanoimprint object. Opaque nanoimprint objects may be illuminated from the underside (vacuum side) of the nanoimprint object while transparent nanoimprint objects may be illuminated from any direction.

Figure 1:
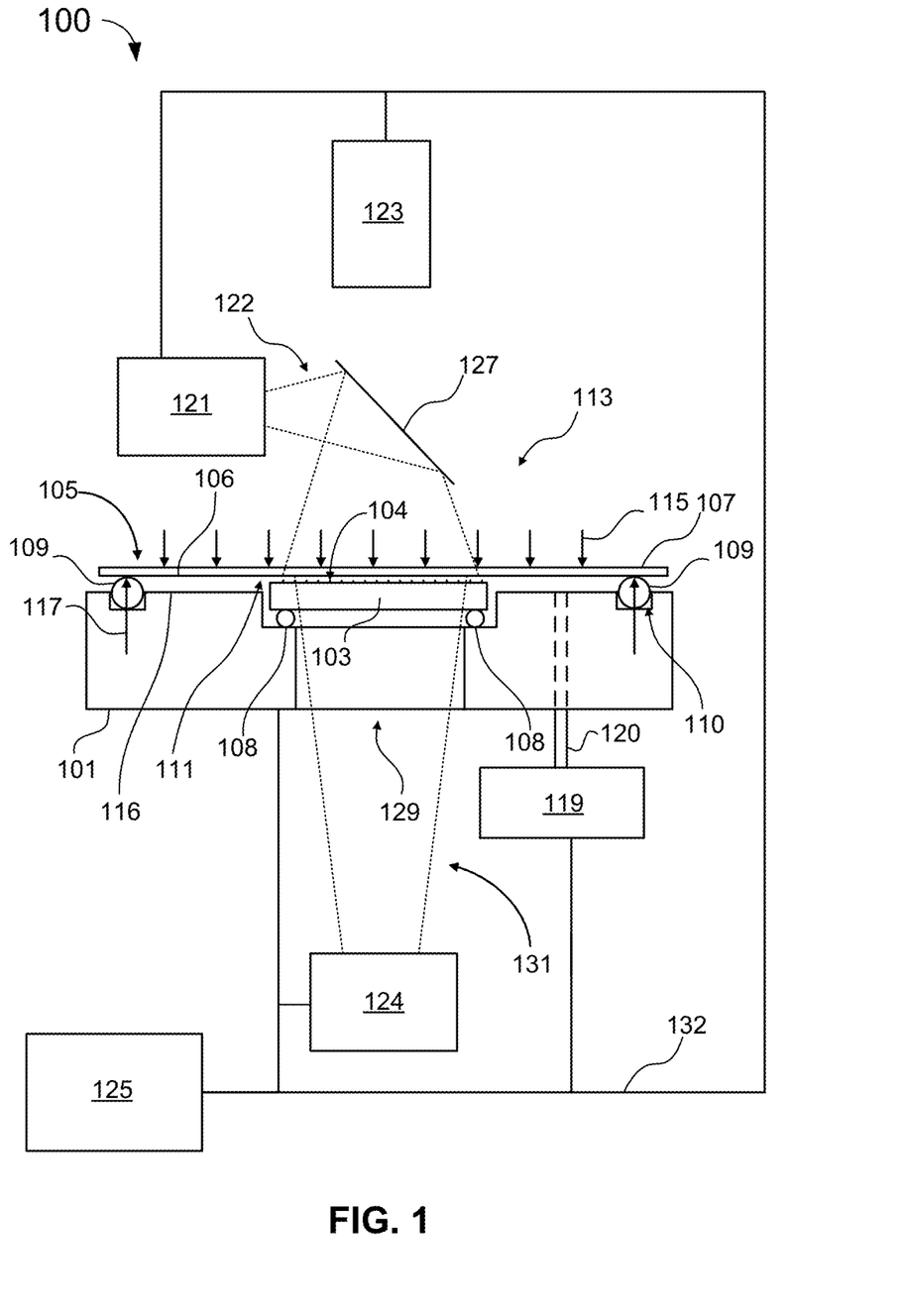
FIG. 1 shows a nanoimprint lithography system according to certain embodiments.

FIG. 1 shows a nanoimprint lithography system according to certain embodiments. The system includes chuck 101 that, during the imprint process, houses a template 103 and supports and secures (through a gas pressure) a nanoimprint object 105. A patterned surface 104 of the template 103 has a pattern, e.g., a nanopattern, disposed thereon. According to certain embodiments, the pattern can be transferred to the inner surface 106 of nanoimprint object 105, e.g., during a UV photo nanoimprint process, as described in further detail below in reference to FIG. 5. For example, during a nanoimprint process, the nanoimprint object 105 need not be secured to a separate vacuum chuck, but rather, the nanoimprint object 105 and the template 103 are both secured in place by the chuck 101, i.e., the nanoimprint object is not held in place by its own separate chuck but rather is held in place by the same chuck that is holding the template. According to certain embodiments, the perimeter of nanoimprint object 105 can be secured against a perimeter support structure 109, e.g., a vacuum seal, gasket and the like, by the action of gas pump 119, which may be a vacuum pump in some embodiments. Gas pump 119 can be fluidly connected to a chamber 111 via one or more inlet(s) 120 (also referred to herein as "vacuum ports"). Accordingly, a gas pressure (also referred to herein as a "vacuum pressure") in chamber 111 can be controlled by gas pump 119, e.g., by pumping a gas out of (or into) chamber 111.

According to certain embodiments, chamber 111 can be a chamber formed by the cooperation of a set of surfaces (referred to herein as "internal surfaces") to form a gas-tight seal between the interior of chamber 111 and outer region 113. As used herein, the term "gas-tight" is not intended to be limited to gas chambers having absolutely no leaks, e.g., having a leak rate of zero. Rather, as would be appreciated by one of ordinary skill in the art with the benefit of this disclosure, some seals, including those that may be considered "gas-tight," may experience some small leak rate without unduly limiting the performance of the system. Further, one of ordinary skill would appreciate that the pressure within chamber 111 is determined by the interplay between the leak rate of chamber 111 and the pumping rate of gas pump 119 as well as the outgassing rate of the various internal surfaces.

Returning to FIG. 1, chamber 111 can be formed by the cooperation of inner surface 116 of chuck 101, the inner surface 106 of nanoimprint object 105, and the inner surface of perimeter support structure 109. As shown in FIG. 1, according to certain embodiments, perimeter support structure 109 may be a gasket or seal that is disposed on inner surface 116 to seal the inner surface 106 of nanoimprint object 105 to the inner surface 116 of chuck 101. To secure the position of perimeter support structure 109, a peripheral channel 110 may be formed within inner surface 116. According to certain embodiments, perimeter support structure 109 may be disposed directly on inner surface 116 without the use of a channel. Initially, nanoimprint object 105 may lay directly (under its own weight) on perimeter support structure 109 with the perimeter portions of nanoimprint object 105 being in direct contact with the surface of the perimeter support structure 109, e.g., in embodiments that employ circular wafer as a substrate, the perimeter support structure 109 may be a circular gasket that supports the circumference of the wafer, as described in further detail below in reference to FIG. 2. According to certain embodiments, template 103 may also be supported by a perimeter support structure 108, e.g., a template seal or gasket, in which case, the perimeter support structure 108 may also cooperate to form a seal for chamber 111.

According to certain embodiments, during a nanoimprint process, a pressure differential can be created resulting in a uniform force being applied along the outer surface 107 of the nanoimprint object 105. The pressure differential may be created when the gas pressure outside the chamber 111 in the outer region 113 is greater than the gas pressure inside the chamber 111. The pressure differential results in a force profile 115, shown in FIG. 1 as a set of vectors that are perpendicular to the outer surface 107 of the nanoimprint object 105. According to certain embodiments, the force profile 115 is physically caused by a gas that is present within outer region 113 and, when the pressure of that gas is higher than the pressure of a gas inside the chamber 111, a uniformly distributed force is applied over the entire outer surface area of the outer surface 107 of nanoimprint object 105. As described in more detail below, the force profile 115 working against the perimeter reaction force 117 of the perimeter support structure 109 may cause a deformation of the nanoimprint object such that inner surface 106 of the nanoimprint object 105 is brought into contact with patterned surface 104 of the template 103 in order to transfer a pattern, e.g., a nanopattern, from the template 103 to the nanoimprint object 105. Examples of deformations of the nanoimprint object are shown and described below in reference to FIGS. 2-5.

Nanoimprint system 100 also includes an illumination device 121 and an imaging system 123. According to certain embodiments, the illumination device 121 can be positioned above the nanoimprint object 105 and can emit illumination that causes a transition (e.g., a liquid-to-solid transition) in an imprint layer (not shown) of the nanoimprint object 105. For example, UV light from illumination device 121 can cure a layer of imprint resin located on inner surface 106 of nanoimprint object 105. The imprint layer may be any layer that can receive an imprint pattern from template 103 by way of the applied pressure differential and may be pre-coated on the template 103 by any process, e.g., by a spin coating process, ink jet process, and the like. According to certain embodiments, the inner surface 106 of nanoimprint object 105 itself may be pliable enough to imprint a nanopattern directly onto the inner surface 106 of the nanoimprint object 105 without the use of a imprint resin layer and thus the illumination device 121 may not be needed. In some embodiments, a transparent nanoimprint object 105 may be used so that the illumination 122 emitted from the illumination device can reach the imprint layer by passing through the nanoimprint object. Illumination of the imprint layer exposes the imprint layer and causes the transition during the nanoimprinting process.

According to certain embodiments, a semi-reflective optical system 127 (e.g., a dichroic mirror and the like) may be employed to receive the emitted illumination 122 from the illumination device 121 and redirect it through the nanoimprint object 105 to the nanoimprint layer and template. Alternatively, or in addition, the nanoimprint object may be illuminated directly using one or more illumination sources. In some embodiments, an opaque nanoimprint object 105 may be used and an illumination device 124 may be positioned below the nanoimprint object and chuck. Accordingly, illumination device 124 can be configured to illuminate the nanoimprint object from below, a configuration referred to herein as "reverse illumination." As can be appreciated by one of ordinary skill in the art with the benefit of this disclosure, there are many ways to configure the chuck and template to allow for reverse illumination, including, e.g., providing a transparent template 103 and or a transparent chuck 101 and also providing a central aperture 129 within chuck 101 such that illumination 131 may pass through the chuck unimpeded.

According to certain embodiments, the imaging system 123 may be configured to image the surface of nanoimprint object 105, e.g., to monitor and characterize the deformation of the nanoimprint object during the imprinting process. As described in more detail below, chuck 101 may further include one or more control pads (not shown) designed to effectuate a particular surface curvature of the nanoimprint object 105 and/or to assist in demolding of the nanoimprint object when patterning is complete. The control pads may be passively controlled with flexible elements and/or may be positioned strategically during the assembly of the chuck with external alignment tooling. Accordingly, the images received by the imaging system 123 may be sent to a processing system within control unit(s) 125 and signals may be generated to control the pressure in the chamber 111 and/or to control the surface deformation of the nanoimprint object 105.

According to certain embodiments, illumination devices 121 and/or 124, imaging system 123, gas pump 119, and/or elements of chuck (e.g. the control pads) may be operatively connected, via control lines 132, and controlled by one or more control unit(s) 125. For simplicity, in FIG. 1, the control unit(s) 125 are shown as a single block but, as would be appreciated by one of ordinary skill in the art, the system components may be controlled with any number of control units, and furthermore, each system may have its own dedicated control circuitry (controlled by one or more ASICs, DSPs, FPGAs, and the like) one or more of which may be directed by a master controller (e.g., a microcontroller having its own dedicated processors, memory, etc.). According to certain embodiments, the control units(s) 125 may be a computer or microcontroller system, such as that described below in reference to FIG. 7 Control lines 132 may be either wired or wireless connections.

While the discussion above in reference to FIG. 1 focused on embodiments that employed a pressure differential formed by a lowering of the pressure in chamber 111 (i.e. forming a vacuum in chamber 111), any method of creating the pressure differential may be employed without departing from the scope of the present disclosure. For example, the pressure differential may be created by increasing a gas pressure in outer region 113 (in which case, a gas pump 119 may or may not be used). Other embodiments may increase the pressure differential by using a gas pressure in outer region 113 as a "gas-assist" in addition to applying a reduced pressure (or vacuum) to chamber 111.

Figure 2:
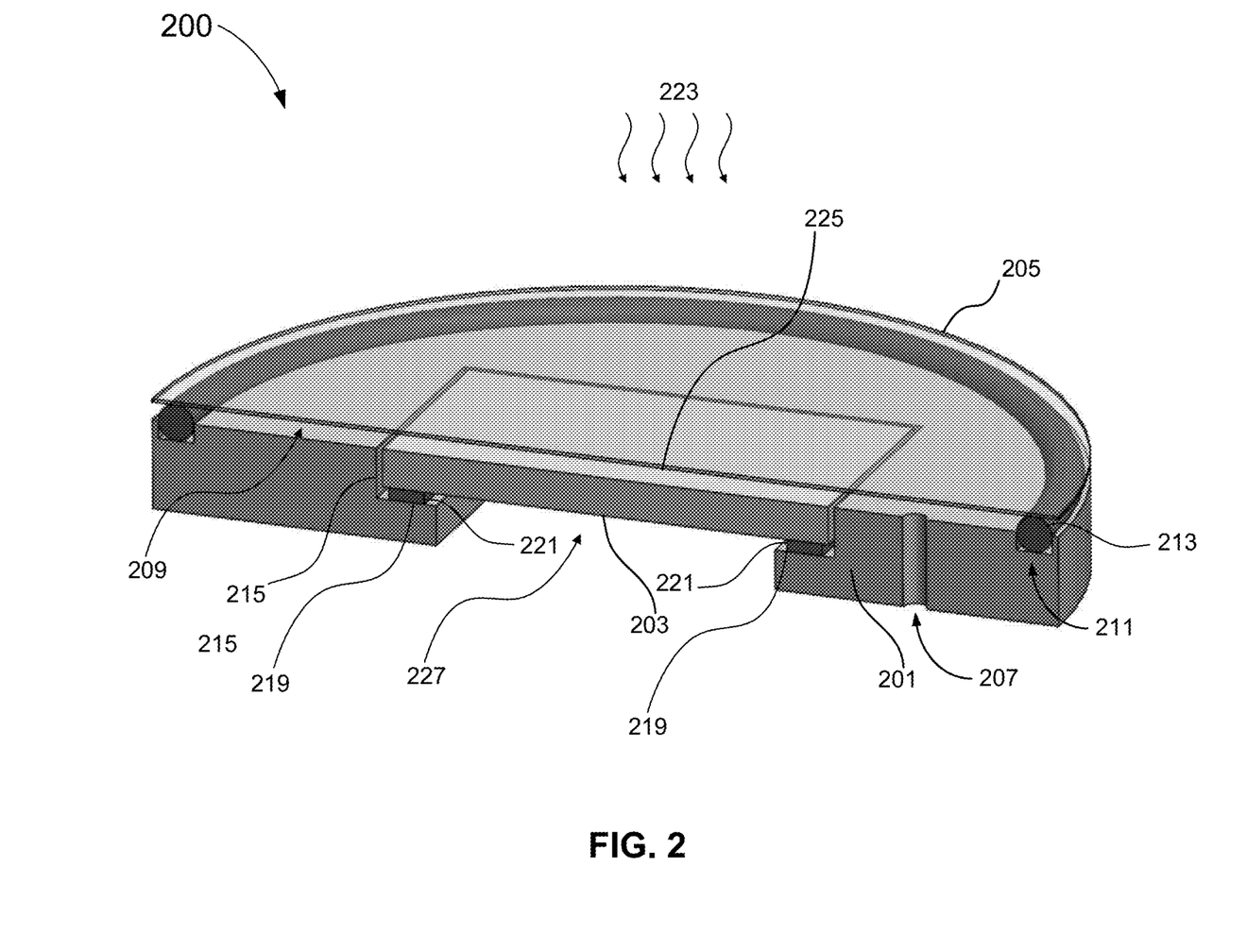
FIG. 2 shows a nanoimprint lithography system according to certain embodiments.

FIG. 2 shows a perspective cross-sectional view of a nanoimprint lithography system 200 according to certain embodiments. Similar to the system described in reference to FIG. 1, the system 200 includes chuck 201 that, during the imprint process, secures and supports both a template 203 and a nanoimprint object 205. One or more inlet(s) 207 provide a passage through the body of chuck 201 such that a gas pump (not shown) may be attached thereto for pumping gas into and out of chamber 209. While one inlet is shown in this example, any number of inlets may be used without departing from the scope of the present disclosure. Like FIG. 1, chamber 209 is defined to be the volume between the nanoimprint object 205 and the chuck 201/template 203 combination. As shown in this perspective view, a circular channel 211 may be formed in the periphery of the body of chuck 201 and a circular perimeter support structure, e.g., a seal 213 may be disposed therein. In some embodiments, the seal may be partially compliant and also may be of a material suitable for use to maintain a vacuum.

In addition, a central recess 215 may be formed in the body of chuck 201. The central recess 215 can include shelf portions 219 to receive and support template 203. The template 203 may rest on shelf portions 219 of the central recess 215. Disposed between the shelf portions 219 and the outer surface of the template 203 is seal 221 for providing a gas-tight seal between the template and the chuck 201. As would be appreciated by one of ordinary skill in the art with the benefit of this disclosure, the chuck 201 and template 203 may be any shape and size. According to certain embodiments, the outer periphery of the chuck 201 may have a shape that matches the outer periphery of the nanoimprint object being patterned, e.g., the outer perimeter may be circular to match a circular shape of the nanoimprint object, as shown here. Other embodiments, may employ other shapes, e.g., a square chuck with a circular nanoimprint object or vice versa.

According to certain embodiments, nanoimprint object 205 may be formed from a transparent substrate material, as shown in FIG. 2. Examples of transparent substrate materials include glass and plastic substrates for optical applications such as nanoimprinting of elements for near-eye displays, diffractive optical elements, printed waveguides, lens arrays, and the like. For example, relatively thin nanoimprint objects may be used where the nanoimprint object has a diameter of approximately 150 mm and thicknesses ranges from 0.100 mm to 1 mm, but any material having any shape and thickness may be used without departing from the scope of the present disclosure. In some embodiments, the nanoimprint pattern can be used as an etch mask for anisotropic or isotropic etch transfer into a substrate. Such applications can include not only optical devices but can also include active devices such as logic, memory, emissive devices such as LEDs, and the like.

As described in further detail above in reference to FIG. 1, during the imprint process, illumination, e.g., illumination 223, may be provided by an illumination source and used to illuminate an imprint layer located on the inner surface 225 of nanoimprint object 205. In some embodiments that employ a non-transparent substrate material, illumination may originate from underneath the chuck 201, pass through an aperture 227, and then transmit through a transparent template. While aperture 227 is shown here to be rectangular, one of ordinary skill in the art with the benefit of this disclosure will appreciate that aperture 227 may be any suitable shape to allow for proper illumination of the imprint layer and template pattern.

Figure 3A:
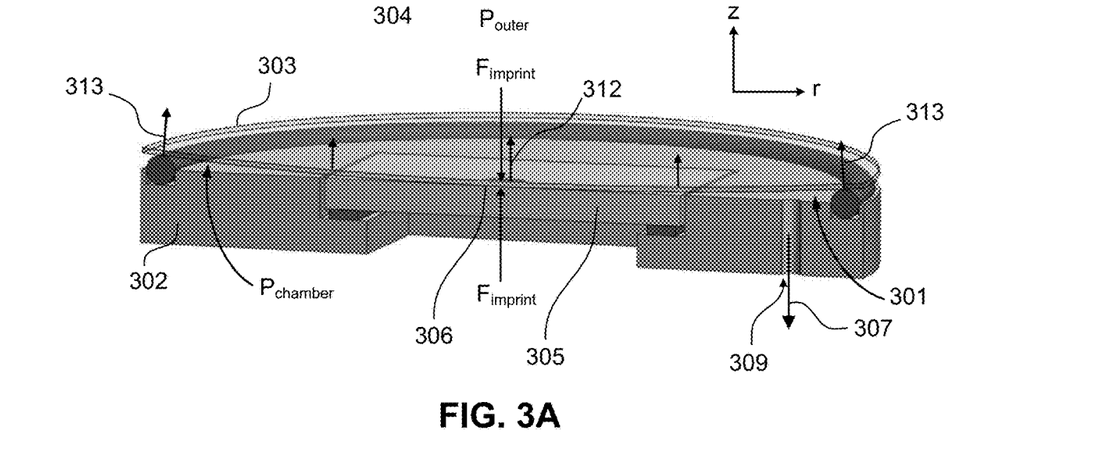
FIGS. 3A and 3B show a nanoimprint lithography system according to certain embodiments.
Figure 3B:
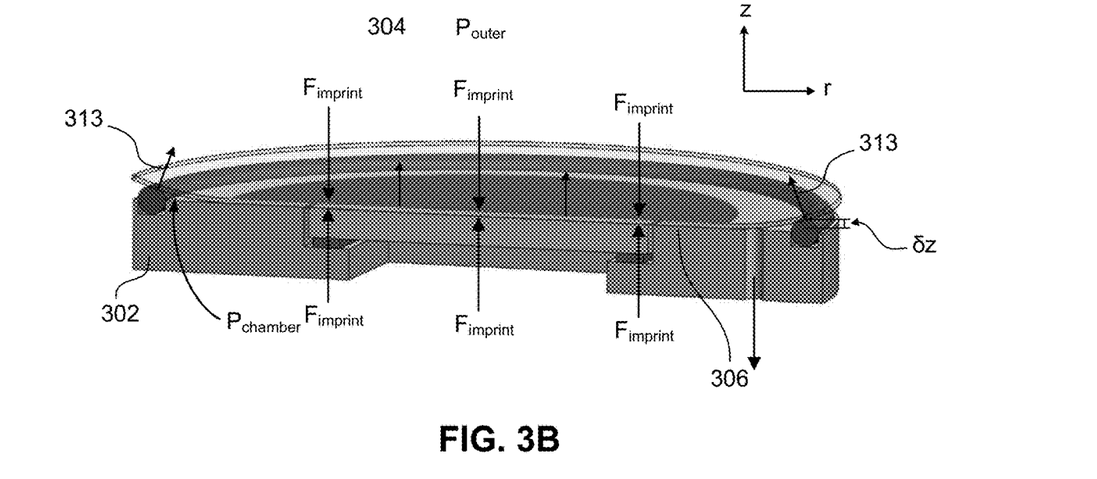
Figure 3C:
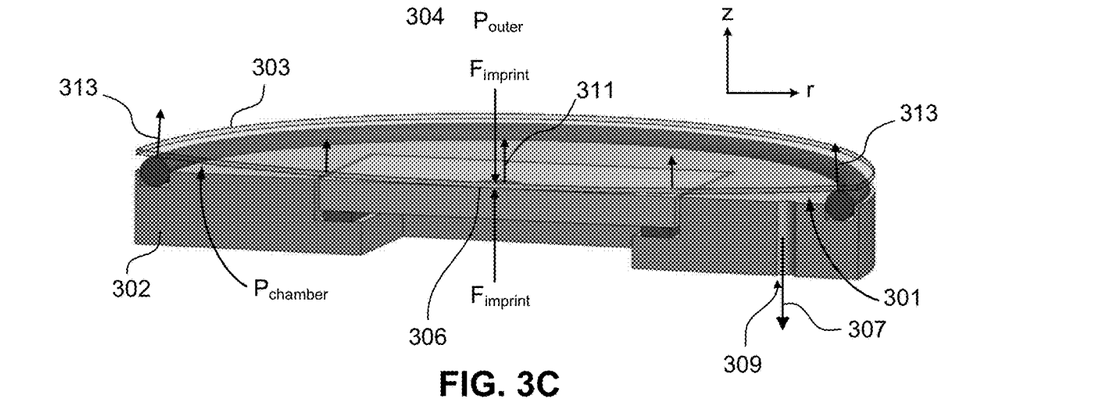

FIGS. 3A-3C show perspective views of a nanoimprint lithography system showing a rigid or semi-rigid nanoimprint object under different states of deformation according to certain embodiments. For the purposes of this discussion, a cylindrical coordinate system is employed with the z-axis defined to be the axis having a direction that is perpendicular to the patterned surface of the template and the r-axis defined to be the axis that is perpendicular to the z-axis, i.e., the axis that is in the plane of the patterned surface of the template. As described above in reference to FIGS. 1-2, a gas-tight chamber 301 can be formed between the chuck 302 and the nanoimprint object 303 such that the nanoimprint object 303 being imprinted actually serves as a deformable wall of the gas-tight chamber.

According to certain embodiments, a gas is pumped out of gas-tight chamber 301, e.g., along pumping direction 307 (out through inlet(s) 309), thereby causing a pressure differential, i.e., ($P_{outer} \neq P_{chamber}$) to develop between the chamber 301 and the outer region 304 above the nanoimprint object 303. In this example, because gas is pumped out of gas-tight chamber 301, the pressure inside the chamber is lower than the pressure outside the chamber, i.e., $P_{outer} > P_{chamber}$. One of ordinary skill having the benefit of this disclosure will recognize that the pressure differential $P_{outer} > P_{chamber}$ can be created by removing gas via inlet 309 as described above or alternatively by keeping the pressure in the chamber 301 constant and increasing the pressure $P_{out}$ in outer region 304 without departing from the scope of the present disclosure.

As the pressure differential develops, the pressure on the outer surface of the nanoimprint object 303 results in a force being applied uniformly along the entire outer surface of the nanoimprint object 303 (shown in FIG. 1). This force drives an elastic deformation of the nanoimprint object 303 and as the nanoimprint object 303 deforms, the inner surface of the nanoimprint object 303 begins to approach the patterned surface of the template 305. More specifically, the nanoimprint object 303 begins to form a concave shape, with the prevailing direction of curvature 312 at the center of the concave surface pointing substantially along the z-axis. Because the nanoimprint object 303 is supported by the peripheral support structure, the center portion of the nanoimprint object contacts the template before the outer portion of the nanoimprint object thereby creating a central contact region 306. Within the central contact region 306, an imprint force $F_{imprint}$ begins to develop and this imprint force holds the inner surface of the nanoimprint object 303 against the inner surface of the template 305 to cause a pattern to be imprinted onto the inner surface of the nanoimprint object 303, e.g., into a photosensitive imprint layer of the nanoimprint object 303.

As the pressure differential increases, the radius of the contact region 306 increases, gradually imprinting a larger and larger area of the nanoimprint object, as shown in FIG. 3B. According to certain embodiments, the pressure differential may be increased until the full area of the template 305 has made contact with the nanoimprint object 303 and the desired imprint force $F_{imprint}$ is uniformly distributed along the surface area of the template 305. In this maximally deformed state, the central region of the nanoimprint object may be forced flat against the template by the resulting force of the pressure differential. At the periphery of the nanoimprint object, the peripheral support structure produces a reaction force 313 and thus the peripheral portion of the nanoimprint object is not pressed flat, but rather may still have a nonzero curvature, as shown most clearly in FIG. 3B. During the bending that occurs as part of the imprinting process, the central portion of the nanoimprint object 303 can displace from its original unbent position by a distance δz, which is related to the distance that the peripheral support structure extends above the inner surface of the of chuck and also the distance above the inner surface of the of chuck that the inner surface of the template is positioned.

According to certain embodiments, the nanoimprint object 303 may be illuminated, e.g., by UV light, while in the maximally deformed state shown in FIG. 3B. During the illumination stage of the process, the nature of the imprint layer may change, e.g., the imprint layer may undergo a transition from liquid to solid, from a gel to a solid, from a liquid to a gel, or whatever transition is appropriate given the chemical and photochemical properties of the imprint layer, as described above in reference to FIGS. 1-2. According to certain embodiments, the transition may also be triggered by infra-red illumination, i.e., by heating, in which case, the imprint layer may include a thermoplastic polymer and the like. In other embodiments, the imprint may be applied to the surface of the substrate directly, without any imprint layer being present (often referred to as resist-free direct thermal nanoimprint lithography). In embodiments that employ direct thermal nanoimprint lithography, the imprint process may occur at elevated pressure and/or temperature and the substrate can have suitable softening characteristics in order to accurately fill the nanoimprint pattern.

Once the imprint layer has transitioned to a mechanically stable state, e.g., after the layer has solidified or cured, the imprinted nanoimprint object 305 is removed from the template. According to certain embodiments, separation (also referred to herein as "demolding") between the template and the patterned nanoimprint object is achieved by reducing the pressure differential, e.g., by introducing gas back into the chamber 301 and/or reducing the pressure in outer region 304. According to certain embodiments, because the nanoimprint object 305 may be formed form a rigid material, e.g., glass or plastic, the nanoimprint object 305 experiences primarily an elastic deformation as a result of the applied pressure differential. Accordingly, upon release of the pressure differential the bulk material of the nanoimprint object 305 will not be permanently deformed, but rather, will to return to its partially unbent shape, as shown in FIG. 3C, and eventually will return to its original (e.g. flat) shape as shown in FIG. 2.

Figure 4A:
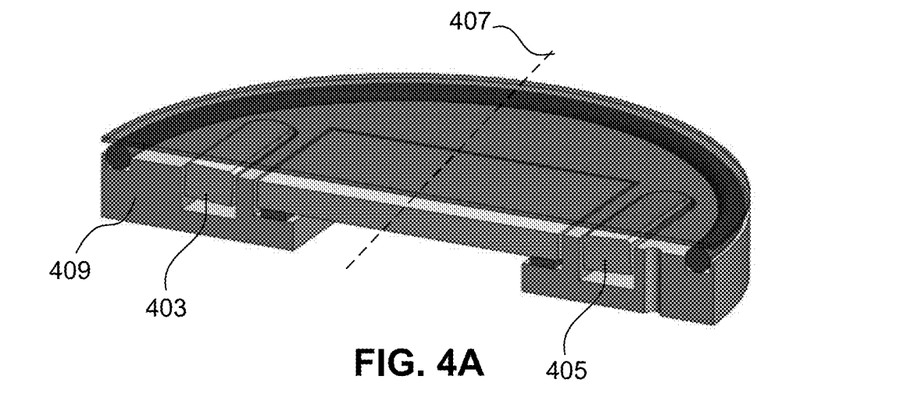
FIGS. 4A-4C show a nanoimprint lithography system according to certain embodiments.
Figure 4B:
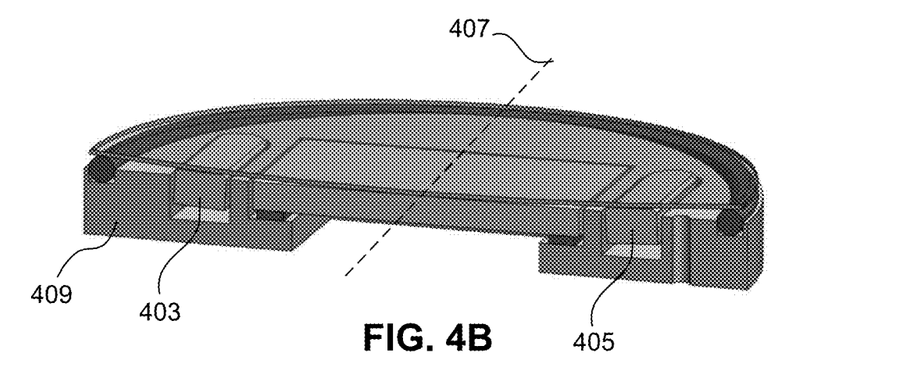
Figure 4C:
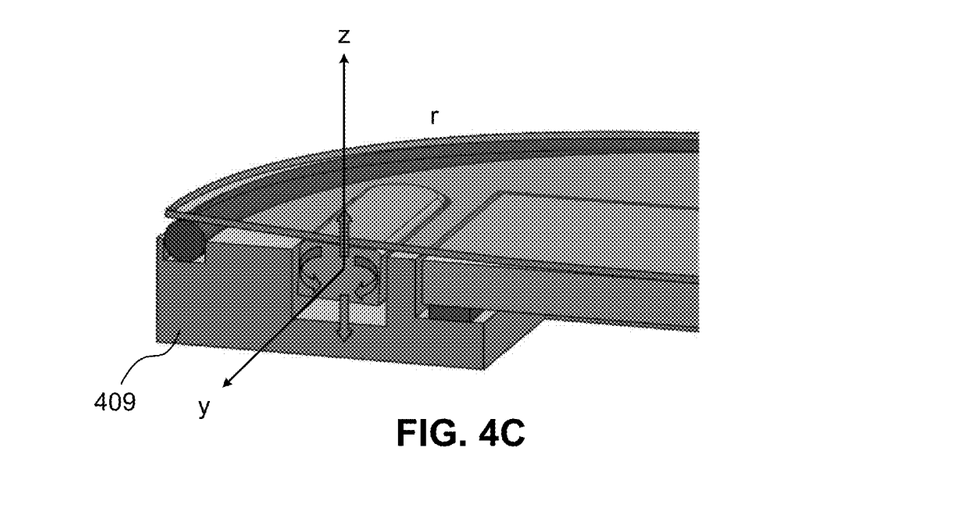

According to certain embodiments, no additional applied forces are necessary to cause the nanoimprint object to successfully demold from the template other than simply reducing the pressure differential. In other embodiments, control pads may be added, e.g., as shown in FIGS. 4A-4C to allow for both a more controlled demolding process and also to allow for a more customized deformation profile during imprinting. FIG. 4A shows an example where control pads 403 and 405 are positioned on either side of the template. The control pads 403 and 405 are symmetrically placed relative to the center line 407 of the chuck 409. In addition, the control pads 403 and 405 may have an elongated shape, e.g. they may be rectangular shaped with a long dimension that is comparable in length to the length of the template.

According to certain embodiments, the linear control pads can serve a dual purpose, they can assist in demolding and they also can ensure that the deformation shape of the nanoimprint object follows a pre-defined shape. For example, FIG. 4A shows the nanoimprint object in an unbent state and control pads 403 and 405 being positioned at an angle such that the surfaces of the pads have a predetermined angle α relative to the surface of the template. The angle α can be set to be a bend angle that is desired for the nanoimprint object in a fully bent state, e.g., as shown in FIG. 4B. In this way, the bend profile (defined to be the shape of the nanoimprint object along a direction that is perpendicular to the center line) may be kept constant as one moves along the centerline direction. For example, without control pads 403 and 405 the deformation shape will be radially symmetric, e.g., the nanoimprint object may take the form of a paraboloid. However, under the influence of control pads 403 and 405 the curvature of the nanoimprint object will not change as one moves along the centerline direction, i.e., cross-sections of the nanoimprint object taken along a direction perpendicular to the centerline 407 will have the same shape as one moves along the centerline 407, e.g., the deformation shape may form more of a parabolic cylinder. Such a configuration more closely matches the strain profile in the nanoimprint object with the shape of the template which can be beneficial for reducing patterning errors.

According to certain embodiments, the control pads may be passively controlled with flexible elements attached therto and/or be positioned strategically during the assembly of the chuck with external alignment tooling. In some embodiments, the position and orientation of the control pads may be actively controlled by any suitable actuation device, as described below in reference to FIG. 6. The pads may also be actively controlled, e.g., control unit(s) 125 can provide control signals to precision translation/rotation stages (not shown) that are operatively connected to the control pads. FIG. 4C illustrates one type of control pad that is moveable both in the +/−z-direction and also can be rotated about the y axis. Such a pad can assist in the demolding process by providing an additional upward (e.g., along the +z direction) force on a peripheral portion of a nanoimprint object. The added demolding force from the control pads can help to separate, in a controlled manner, the imprinted nanoimprint object from the edges of the template. According to certain embodiments, the control pads may apply the demolding force before, during, or after the pressure differential is reduced.

Figure 5A:
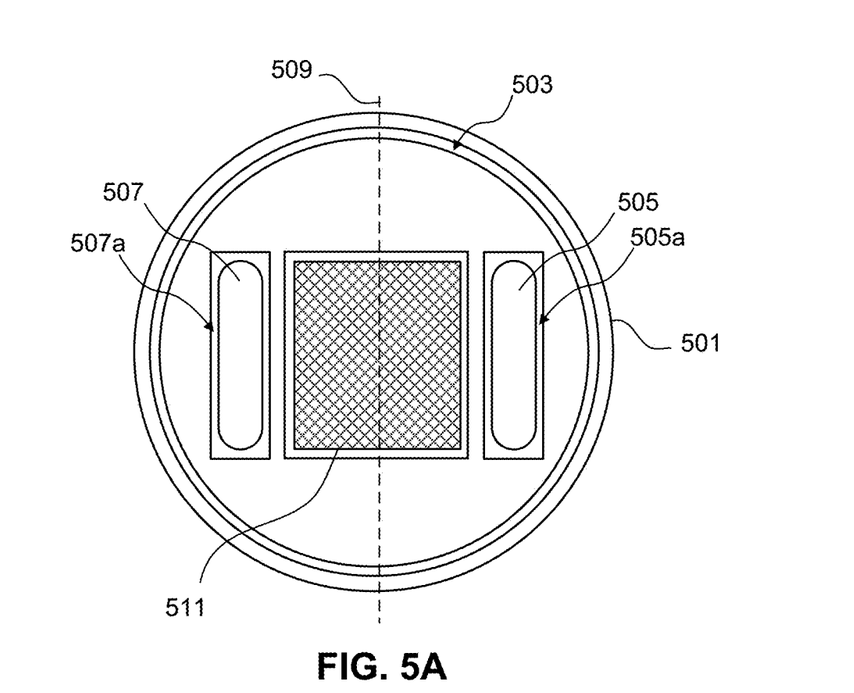
FIGS. 5A-5B show nanoimprint lithography system according to certain embodiments.

FIGS. 5A and 5B show top views of other arrangements of control pads that can be employed without departing from the scope of the present disclosure. For example, FIG. 5A shows a top view of a chuck 501 that includes a circular channel 503 for supporting a perimeter support structure (not shown). Also shown are two rectangular control pads 505 and 507, similar to those described above in reference to FIGS. 4A-4C. These pads are arranged symmetrically about central axis 509 and each pad can be disposed within a corresponding slot 505a and 507a formed within the chuck 501. As shown here, the length of the control pads can be comparable (e.g., equal to) the length of the template 511 but some embodiments may have pads of any suitable length. In addition, more than two pads can be employed.

Figure 5B:
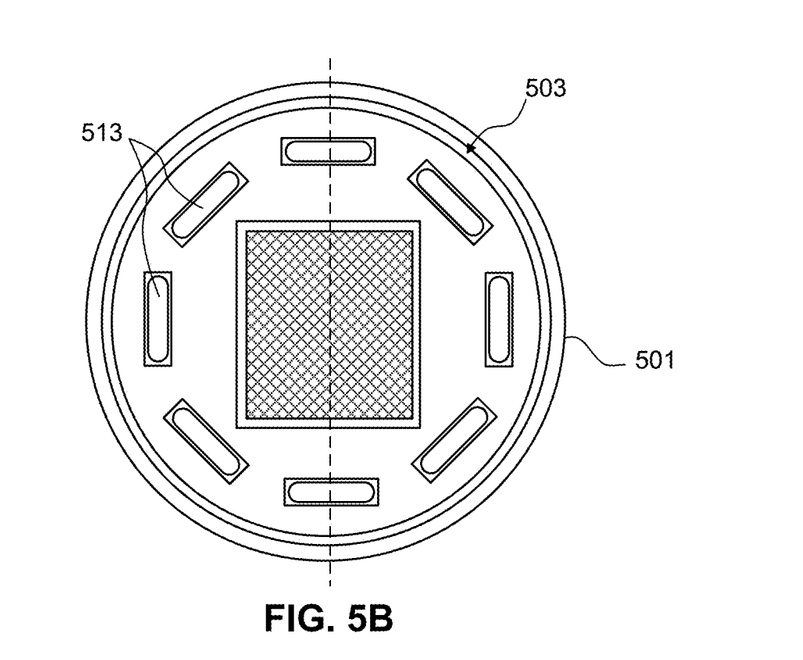

FIG. 5B shows an embodiment with an arrangement of multiple control pads. In this embodiment, 8 control pads, e.g., control pads 513, are positioned radially around the template to provide more granular control of the deformation and demolding process. As would be appreciated by one of ordinary skill in the art with the benefit of this disclosure, the system may employ any number and configuration of control pads and the shape of each control pad may be tailored to provide a specific type of control surface.

Figure 6:
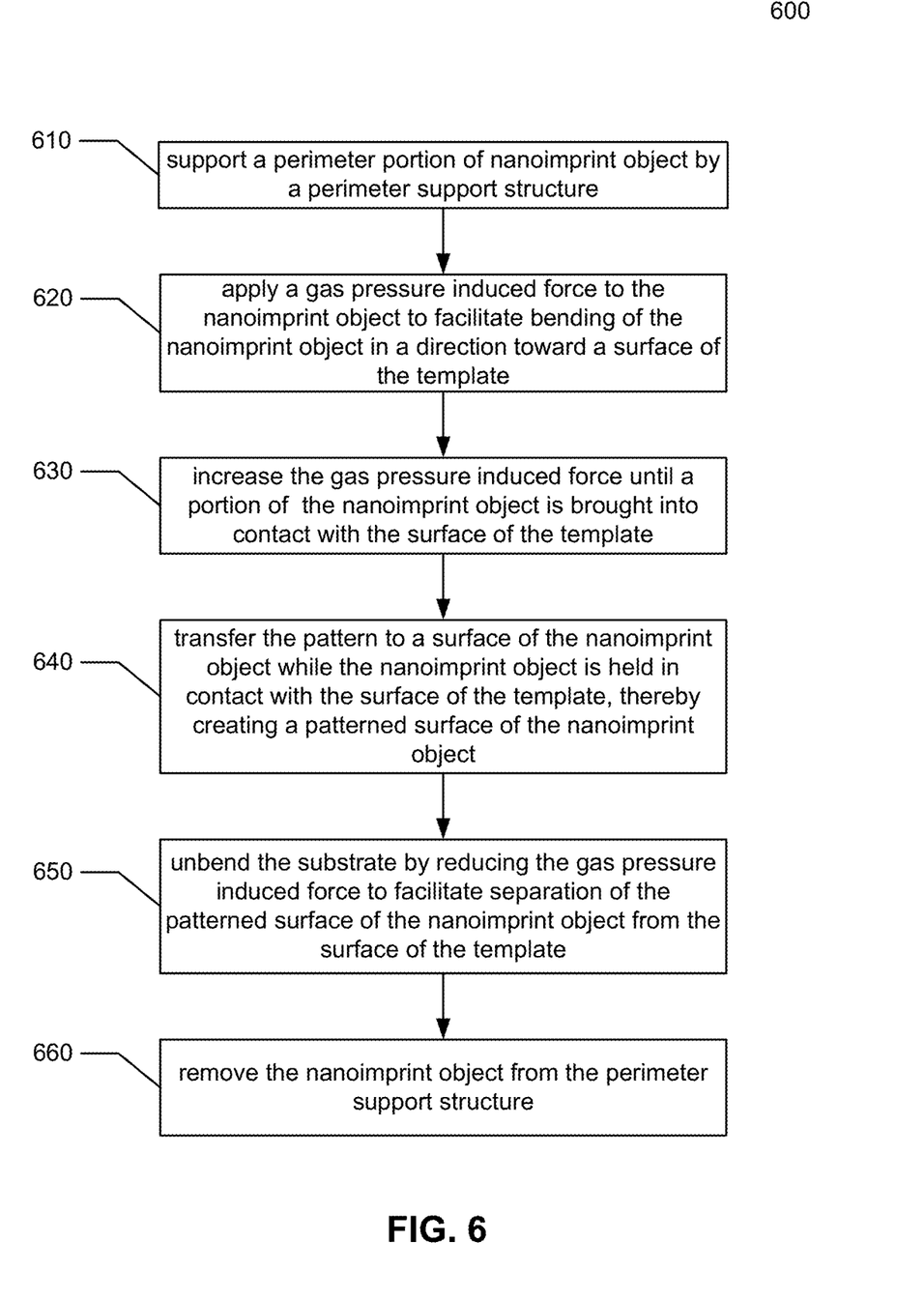
FIG. 6 is a simplified flowchart depicting a method for nanoimprint lithography according to certain embodiments.

FIG. 6 shows a flow chart depicting a method for nanoimprint lithography according to certain embodiments. The method steps may be performed by one or more of the system blocks shown in any of FIGS. 1-5. For example, one or more control units within a nanoimprint lithography system, e.g., control unit(s) 125 shown in FIG. 1 may execute computer code or instructions that result in one or more of the steps of the method being performed by other system blocks, e.g., pumps, control pads, illumination devices, and the like. Other steps may be directly performed using a system block's integrated control circuitry or internal mechanical elements. For the sake of simplicity, the operation of a system block's well-known electronic and/or mechanical elements that may perform part or all of the steps described below are not described in detail.

In step 610, a perimeter portion of a nanoimprint object is supported by a perimeter support structure. According to certain embodiments, the perimeter support structure may be a seal or gasket and can be disposed within a channel that is formed within a chuck that houses a nanoimprint template, e.g., as shown in FIGS. 1-5. As described above in reference to FIGS. 1-4, the inner surface of the nanoimprint object can be sealed to the inner surface of the chuck by the perimeter support structure in which case, the template is sealed within a gas-tight chamber, e.g., chamber 111 of FIG. 1 and chamber 209 of FIG. 2, formed between the nanoimprint object and the chuck, with an inner surface of the nanoimprint object forming a flexible chamber wall of the chamber. Accordingly, during the imprint process, the template and the nanoimprint object are both secured by a single chuck and furthermore, there is no need to employ separate complex mechanical support structures for the nanoimprint object.

In step 620, a gas pressure induced force is applied to the nanoimprint object, e.g., to a surface of the nanoimprint object, to facilitate bending of the nanoimprint object in a direction toward a surface of the template. Examples of the system under various strengths of the pressure induced force are shown in FIGS. 3A-3C. According to certain embodiments, the gas pressure induced force (e.g., depicted as force profile 115 in FIG. 1) can be created by a gas pressure differential between the inside of the chamber and the region outside of the chamber. For example, the pressure differential can be created by generating a $P_{chamber}$ that is less than a gas pressure outside the chamber $P_{outer}$, e.g., by pumping gas out of the chamber using a vacuum pump, e.g., gas pump 119 as described above in reference to FIG. 1. Alternatively, or in combination with the operation of a gas pump, the gas pressure induced force can be cause by a pressure differential that is created by causing $P_{outer}$ to be greater than $P_{chamber}$, e.g., by pumping pressurized gas into the region above the nanoimprint object, e.g., as described above in reference to FIGS. 3A-3C. According to certain embodiments, the nanoimprint object can be formed from a rigid transparent material, e.g., glass or plastic, and the bending that results in response to the pressure can be an elastic deformation of the material. Other embodiments can also employ non-transparent or semi-transparent nanoimprint objects without departing from the scope of the present disclosure.

In step 630, the gas pressure induced force is increased until a portion, e.g., a central portion, of the nanoimprint object is brought into contact with the surface of the template. In the case where the nanoimprint object is formed from a uniform density bulk material and is relatively thin, e.g., a thin glass or plastic wafer, the deformation of the nanoimprint object will be uniform under the effect of the gas pressure induced force. For example, as shown in FIG. 3A, as the gas pressure is gradually increased, the nanoimprint object begins to form a concave shape (as viewed from above), with the center of the nanoimprint object displacing more relative to the perimeter. At first, contact between the template and the nanoimprint object is made at the center of the nanoimprint object, as described above in reference to FIG. 3A. As the gas pressure is gradually increased, the contact area gradually increases with the radius of the contact area gradually increasing until the nanoimprint object is contacting a corresponding surface area of the template that is required for transferring the pattern to the nanoimprint object, e.g., as shown and described in more detail above, in reference to FIG. 3B.

In step 640, the pattern is transferred to the surface of the nanoimprint object while the nanoimprint object is held in contact with the surface of the template, thereby creating a patterned surface of the nanoimprint object. According to certain embodiments, before it is patterned, the nanoimprint object can include a pliable imprint layer disposed on its inner surface. According to certain embodiments, the pliable imprint layer can be an imprint photoresist layer (e.g., a monomer or polymer formulation) that has been previously coated by a spin coating process, an ink jet process, and the like, as described above in reference to FIG. 1. The nano-pattern may be transferred by exposing, i.e., illuminating, the photoresist layer with light that originates from an illumination source, e.g., a UV light source as described above in reference to FIG. 1. During illumination, the imprint layer may cure, i.e., transition from a pliable state to a solid state as the molecules of the photoresist interact with the UV light. While UV photoresist are disclosed herein as one example, the method may employ any type of photosensitive substance and any corresponding light source without departing from the scope of the present disclosure. As described above in reference to FIG. 3B, the imprint layer may be heat curable, e.g., a thermoplastic polymer and the like. In some embodiments, an extra pliable layer need not be employed at all if the nanoimprint object itself possesses a suitable softening characteristic such that the imprint pattern may be transferred directly to the inner surface of the nanoimprint object, as also described above in reference to FIG. 3B.

In step 650, the gas pressure induced force is gradually released, causing the nanoimprint object to unbend (e.g., elastically deform back to its original shape). According to certain embodiments, the nanoimprint object may return to its original flat, planar shape, as shown in FIG. 1 or FIG. 4A. The reduction of the gas pressure induced force also facilitates the separation of the patterned surface of the nanoimprint object from the surface of the template. According to certain embodiments, one or more control pads may also assist in facilitating a more controlled separation of the nanoimprint object from the template, e.g., as described above in reference to FIGS. 4-5.

In step 660, the nanoimprint object is removed from the perimeter support structure. Removal of the nanoimprint object can be accomplished by any means known in the art, e.g., using robotic nanoimprint object placement equipment and the like.

The steps described above in FIG. 6 may be automated and therefor implemented in software (e.g., code, instructions, program) executed by one or more processing units (e.g., processors, cores) of the respective systems, hardware, or combinations thereof. The software may be stored on a non-transitory storage medium (e.g., on a memory device). The method presented in FIG. 6 and described above is intended to be illustrative and non-limiting. Although FIG. 6 depicts the various steps occurring in a particular sequence or order, this is not intended to be limiting. In certain embodiments, the steps may be performed in some different order or some steps may also be performed in parallel.

Systems and methods depicted in FIGS. 1-6 are merely a examples and are not intended to unduly limit the scope of inventive embodiments recited in the claims. One of ordinary skill in the art would recognize many possible variations, alternatives, and modifications. For example, in some implementations, the systems may have more or fewer blocks/elements/devices than those shown, may combine two or more blocks/elements/devices, or may have a different configuration or arrangement of blocks/elements/devices.

The systems and methods described above provide for nanoimprinted products having improved properties in a number of respects. First, because the nanoimprint object is not held in its own dedicated vacuum chuck, uncontrolled and undesirable deformation of the nanoimprint object due to the surface variations of the vacuum chuck can be reduced or eliminated. More specifically, in the method disclosed herein, the deformation of the nanoimprint object surface is caused by the gas pressure induced force and as such is uniformly applied across the surface of the nanoimprint object. As such, deformation of the nanoimprint object is determined to a large extent by the internal mechanical properties of the nanoimprint object, e.g., by the glass or plastic substrate. Because a nanoimprint object is typically composed of very uniform materials (e.g. uniform density glass) they will also possess uniform mechanical properties (e.g., uniform elasticity, tensile strength, etc.). Because of this uniformity in mechanical properties of the underlying nanoimprint object, the vacuum induced deformation is also very uniform across the entirety of the nanoimprint object.

Second, the design of the system provides for better control of the deformation of the nanoimprint object surface during the imprinting and demolding processes. According to certain embodiments, e.g., as described above in reference to FIGS. 4-5, moveable control pads can be incorporated into the contact surface of the chuck that holds the nanoimprint object template. These control pads may be passively controlled with flexible elements and/or can be actuated by electrical, electromagnetic or mechanical means (via piezo, linear elect motors, one or more precision translation/rotation stages, and the like) and may be actively controlled via one or more processors in a control unit to provide a precisely defined and controlled counter-force (also referred to herein as a restoring force) to the uniform vacuum pressure-induced force. In addition, the shape of the surface of the nanoimprint object can be monitored from above using interferometric or other optical methods and be provided as an input to the control system. In one example, deformation control pads may be embedded within the same chuck that holds the rigid template and may be used to alter the surface profile of the deformed nanoimprint object from a paraboloid to a parabolic cylinder. In addition, the deformation control pads may also improve repeatability and control in the de-molding process.

Third, because the inner surface of the nanoimprint object is held near its outer periphery, the vacuum induced displacement is, at first, greatest in the central portion of the nanoimprint object. Such a deformation is beneficial because it leads to the central portion of the nanoimprint object first contacting the template and then the contact region proceeds radially outward in a controlled manner. Such a method leads to a more uniform distribution of photoresist in the mold during pattern transfer and also leads to a reduction in voids or gaps as the fluid is forced radially from the center outward.

Fourth, as the deformed nanoimprint object makes full contact with the rigid template, the nanoimprint object becomes flat again—essentially following the surface of the rigid template. In comparison with existing methods that employ flexible templates, the method disclosed herein provides for a more uniform contact surface across the patterned template, as the originally paraboloid shape of the deformed nanoimprint object gives way to the flat shape of the underlying rigid mold. To compensate for slight vertical misalignments of the mold relative to its housing chuck, additional compliant bumpers may be employed along the periphery of the recess housing the template to provide a gradual and compliant transition region between the edges of the template and the chuck surface. In this way, pattern errors on the edges of the nanoimprint object can be reduced. In addition, the position and orientation of the rigid template itself may be actively controlled using a six-axis rotational-positional control system.

While the embodiments discussed herein related to planer/flat nanoimprint object and templates, nanoimprint objects and templates having any shape may be employed without departing from the scope of the present disclosure. For example, the natural shape of the bulk nanoimprint object may be concave or convex (or the natural shape of an inner surface of the nanoimprint object may be concave or convex) and such a nanoimprint object can be paired with a rigid template that is either convex or concave, respectively.

Figure 7:
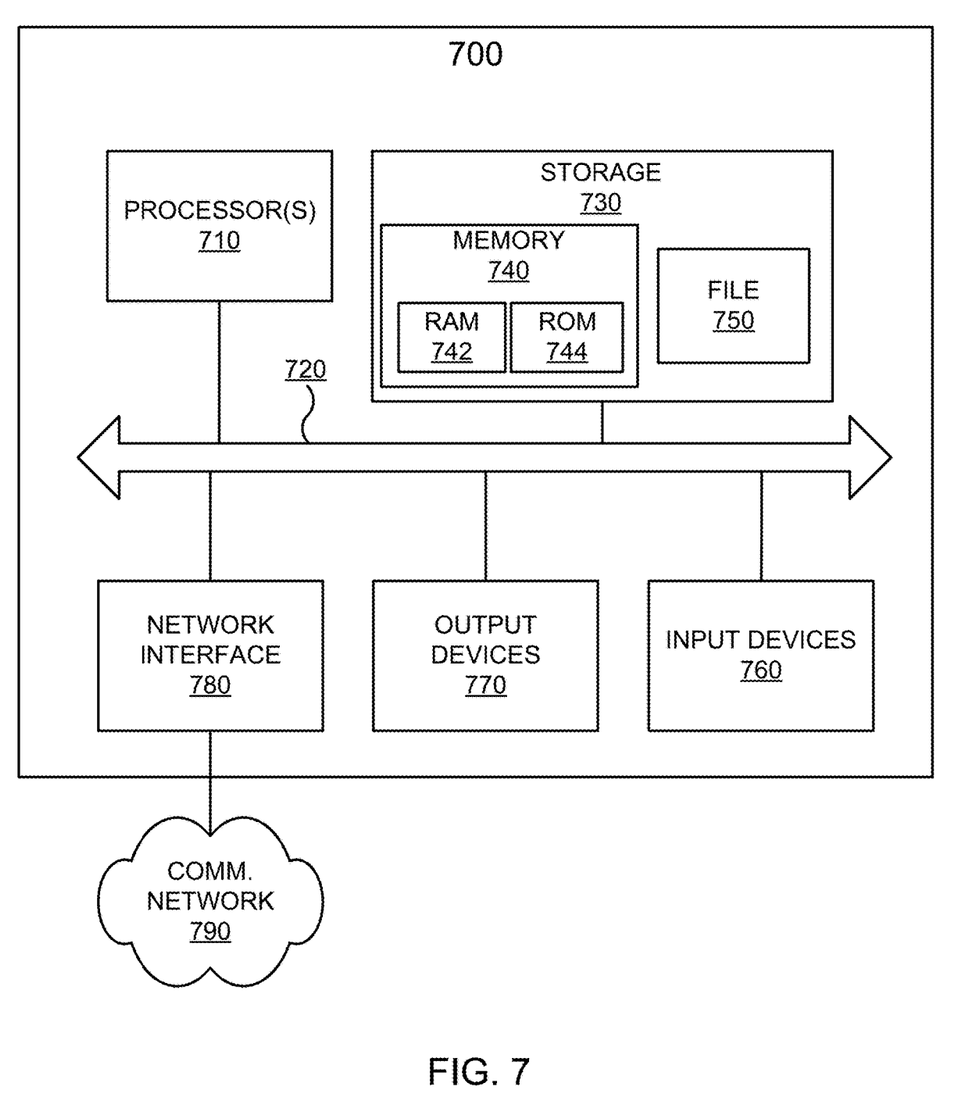
FIG. 7 is a computer system according to certain embodiments.

FIG. 7 illustrates an example of computer system 700, which may be used to implement certain embodiments described herein. For example, in some embodiments, computer system 700 may be any of the control units described above, e.g., control unit(s) 125 and/or any dedicated control unit for any of the system blocks of FIG. 1. In this example, computer system 700 includes one or more processors 710, a bus 720, a storage system 730, one or more input devices 760, one or more output devices 770, a network interface 780, and the like.

In the present example, input device(s) 760 may include a computer mouse, a trackball, a track pad, a joystick, a wireless remote controller, a drawing tablet, a voice command system, an eye tracking system, and the like. Input device(s) 760 may allow a user to select objects, icons, text, and the like that appear on an output device 770 (e.g., a monitor or display device) via a command such as a click of a button or the like. Output devices 770 may include, without limitation, a display device (e.g., a monitor), a printer, light-emitting diodes (LEDs), speakers, and/or the like.

Examples of network interface 780 may include an Ethernet card, a modem (telephone, satellite, cable, ISDN), (asynchronous) digital subscriber line (DSL) unit, FireWire interface, universal serial bus (USB) interface, general purpose interface bus (GPM), and the like. For example, network interface 780 may be coupled to a communication network 790, to a FireWire bus, or the like. In other embodiments, network interface 780 may be physically integrated on the motherboard of computer system 700, may be a software program, such as soft DSL, or the like.

Processor(s) 710 may include, without limitation, one or more general-purpose processors, one or more special-purpose processors (e.g., digital signal processing (DSP) chips, graphics acceleration processors, application-specific integrated circuits (ASICs), and/or the like), and/or other processing structures or means, which can be configured to perform one or more of the methods described herein.

Storage system 730 may include, without limitation, local and/or network accessible storage, and/or can include, without limitation, a disk drive, a drive array, an optical storage device, such as a compact disk read-only memory (CD-ROM) or digital versatile disk (DVD), a solid-state storage device, which may be configured to implement any appropriate data stores, including, without limitation, various file systems 750, database structures, and/or the like. Storage system 730 may include memory 740, such as a random access memory (RAM) 742, and/or a read-only memory (ROM) 744, which can be programmable, flash-updateable, and/or the like. An operating system may be stored in file systems 750, and may be loaded to RAM 742 when computer system 700 is booted. RAM 742 and the disk drive are examples of tangible media configured to store data including executable computer code, human readable code, photos, videos, maps, and other data collected by various entities, heat maps, or the like.

In various examples, computer system 700 may also include software that enables communications over a network using, for example, the HTTP, TCP/IP, RTP/RTSP protocols, and the like. In alternative embodiments, other communications software and protocols may also be used, such as IPX, UDP, or the like.

In the preceding description, for the purposes of explanation, specific details are set forth in order to provide a thorough understanding of examples of the disclosure. However, it should be apparent that various examples may be practiced without these specific details. For example, circuits, systems, networks, processes, and other components may be shown as components in block diagram form in order to not obscure the examples in unnecessary detail. In other instances, well-known circuits, processes, algorithms, structures, and techniques may have been shown without necessary detail in order to avoid obscuring the examples. The figures and description are not intended to be restrictive.

The description provides examples only, and is not intended to limit the scope, applicability, or configuration of the disclosure. Rather, the description of the examples provides those skilled in the art with an enabling description for implementing an example. It should be understood that various changes may be made in the function and arrangement of elements without departing from the spirit and scope of the disclosure as set forth in the appended claims.

Also, it is noted that individual examples may be described as a process which is depicted as a flowchart, a flow diagram, a data flow diagram, a structure diagram, or a block diagram. Although a flowchart may describe the operations as a sequential process, many of the operations may be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination may correspond to a return of the function to the calling function or the main function.

The term "machine-readable storage medium" or "computer-readable storage medium" includes, but is not limited to, portable or non-portable storage devices, optical storage devices, and various other mediums capable of storing, containing, or carrying instruction(s) and/or data. A machine-readable storage medium or computer-readable storage medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements.

Furthermore, examples may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. One or more processors may execute the software, firmware, middleware, microcode, the program code, or code segments to perform the necessary tasks.

One or more embodiments may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Systems depicted in some of the figures may be provided in various configurations. In some embodiments, the systems may be configured as a distributed system where one or more components of the system are distributed across one or more networks such as in a cloud computing system.

Where components are described as being "configured to" perform certain operations, such configuration may be accomplished, for example, by designing electronic circuits or other hardware to perform the operation, by programming programmable electronic circuits (e.g., microprocessors, or other suitable electronic circuits) to perform the operation, or any combination thereof.

The terms and expressions that have been employed in this disclosure are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although certain concepts and techniques have been specifically disclosed, modification and variation of these concepts and techniques may be resorted to by those skilled in the art, and that such modifications and variations are considered to be within the scope of the systems and methods as defined by this disclosure.

Although specific embodiments have been described, various modifications, alterations, alternative constructions, and equivalents are possible. Embodiments are not restricted to operation within certain specific data processing environments, but are free to operate within a plurality of data processing environments. Additionally, although certain embodiments have been described using a particular series of transactions and steps, it should be apparent to those skilled in the art that this is not intended to be limiting. Although some flowcharts describe operations as a sequential process, many of the operations may be performed in parallel or concurrently. In addition, the order of the operations may be rearranged. A process may have additional steps not included in the figure. Various features and aspects of the above-described embodiments may be used individually or jointly.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented as a computer program product containing computer program code or instructions executable by one or more processors for performing any or all of the steps, operations, or processes described in this disclosure, where the computer program may be stored on a non-transitory computer readable medium. The various processes described herein may be implemented on the same processor or different processors in any combination.

Where devices, systems, components or modules are described as being configured to perform certain operations or functions, such configuration may be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes may communicate using a variety of techniques including but not limited to conventional techniques for inter-process communications, and different pairs of processes may use different techniques, or the same pair of processes may use different techniques at different times.

Specific details are given in this disclosure to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of other embodiments. Rather, the preceding description of the embodiments will provide those skilled in the art with an enabling description for implementing various embodiments. Various changes may be made in the function and arrangement of elements.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method for transferring a pattern from a template to a nanoimprint object, the method comprising:
   supporting a perimeter portion of the nanoimprint object by a perimeter support structure to form a space between the nanoimprint object and the template;
   applying a gas pressure induced force to the nanoimprint object to facilitate bending of a central portion of the nanoimprint object in a direction toward a surface of the template based on drawing a gas out of the space;
   increasing the gas pressure induced force until the central portion of the nanoimprint object is brought into contact with the surface of the template; and
   transferring the pattern to a surface of the nanoimprint object while the nanoimprint object is held in contact with the surface of the template, thereby creating a patterned surface on the nanoimprint object.

2. The method of claim 1, wherein the nanoimprint object is planar in shape.

3. The method of claim 1,
   wherein the nanoimprint object comprises a pliable substrate; and
   wherein the pattern is transferred to a surface of the pliable substrate.

4. The method of claim 1,
   wherein the nanoimprint object comprises a substrate layer and a pliable layer disposed on the substrate layer; and
   wherein the pattern is transferred to a surface of the pliable layer.

5. The method of claim 4, wherein the pliable layer comprises a layer of photoresist material.

6. The method of claim 1, further comprising actuating one or more control pads, while the nanoimprint object is held in contact with the surface of the nanoimprint object, to control a deformation shape of the nanoimprint object.

7. The method of claim 1, wherein the nanoimprint object forms a flexible chamber wall of a chamber that houses the template.

8. The method of claim 7, wherein the gas pressure induced force is caused by a pressure differential, and the pressure differential is caused by reducing a gas pressure inside the chamber relative to a gas pressure outside the chamber.

9. The method of claim 7, wherein the gas pressure induced force is caused by a pressure differential, and the pressure differential is caused by increasing a gas pressure outside the chamber relative to a gas pressure inside the chamber.

10. The method of claim 1, further comprising:
    unbending the nanoimprint object by reducing the gas pressure induced force to facilitate separation of the patterned surface of the nanoimprint object from the surface of the template; and
    removing the nanoimprint object from the perimeter support structure.

11. The method of claim 10, further comprising actuating one or more control pads to provide a controlled counterforce that further facilitates separation of the patterned surface of the nanoimprint object from the surface of the template.

12. The method of claim 10, wherein the bending and unbending of the nanoimprint object are elastic deformations of the nanoimprint object.

13. The method of claim 1, wherein the nanoimprint object forms a flexible chamber wall of a first chamber; and wherein the template is housed in a second chamber, the second chamber being connected to the first chamber.

14. The method of claim 13, wherein the second chamber is in a chuck that also includes the perimeter support structure.

15. The method of claim 13, wherein the second chamber includes a shelf portion to support the template; and
wherein a first seal is disposed between the shelf portion and the template to form the second chamber.

16. The method of claim 13, wherein a second seal is disposed between the perimeter portion of the nanoimprint object and the perimeter support structure to form the first chamber.

17. The method of claim 1, wherein a shape of the perimeter support structure matches a shape of the nanoimprint object.

18. The method of claim 1, wherein the nanoimprint object is formed from a transparent material.

19. The method of claim 1, wherein the gas pressure induced force is applied until a second portion of the nanoimprint object is brought into contact with a control pad such that the nanoimprint object follows a pre-defined shape.

20. The method of claim 19, wherein the pre-defined shape comprises a pre-defined curvature.

21. The method of claim 19, further comprising: separating the nanoimprint object from the template after the pattern is transferred to the surface of the nanoimprint object; and
wherein the separating is performed based on at least one of: reducing the gas pressure induced force, or moving the control pad against the nanoimprint object.

22. A method for transferring a pattern from a template to a nanoimprint object, the method comprising:
supporting a perimeter portion of the nanoimprint object by a perimeter support structure, wherein the nanoimprint object forms a flexible chamber wall of a chamber that houses the template;
applying a gas pressure induced force to the nanoimprint object to facilitate bending of a central portion of the nanoimprint object in a direction toward a surface of the template;
increasing the gas pressure induced force until the central portion of the nanoimprint object is brought into contact with the surface of the template; and
transferring the pattern to a surface of the nanoimprint object while the nanoimprint object is held in contact with the surface of the template, thereby creating a patterned surface on the nanoimprint object.

23. The method of claim 22, wherein the chamber comprises a first chamber and a second chamber;
wherein the second chamber houses the template; and
wherein the first chamber is connected to the first chamber, the nanoimprint object forming the flexible chamber wall of the first chamber.

24. The method of claim 23, wherein the second chamber is in a chuck that also includes the perimeter support structure.

25. The method of claim 23, wherein the second chamber includes a shelf portion to support the template; and
wherein a first seal is disposed between the shelf portion and the template to form the second chamber.

26. The method of claim 23, wherein a second seal is disposed between the perimeter portion of the nanoimprint object and the perimeter support structure to form the first chamber.

27. The method of claim 23, wherein a shape of the perimeter support structure matches a shape of the nanoimprint object.

28. The method of claim 22, wherein the nanoimprint object is formed from a material.

29. The method of claim 22, wherein the gas pressure induced force is applied until a second portion of the nanoimprint object is brought into contact with a control pad such that the nanoimprint object follows a pre-defined shape.

30. The method of claim 29, wherein the pre-defined shape comprises a pre-defined curvature.

31. The method of claim 29, further comprising: separating the nanoimprint object from the template after the pattern is transferred to the surface of the nanoimprint object; and
wherein the separating is performed based on at least one of: reducing the gas pressure induced force, or moving the control pad against the nanoimprint object.

* * * * *